United States Patent
Sakuma et al.

(10) Patent No.: US 11,527,462 B2
(45) Date of Patent: Dec. 13, 2022

(54) CIRCUIT SUBSTRATE WITH MIXED PITCH WIRING

(71) Applicant: International Business Machines Corporation, Armonk, NY (US)

(72) Inventors: Katsuyuki Sakuma, Fishkill, NY (US); Shidong Li, Hopewell Junction, NY (US); Kamal K. Sikka, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 135 days.

(21) Appl. No.: 16/714,174

(22) Filed: Dec. 13, 2019

(65) Prior Publication Data
US 2021/0183753 A1 Jun. 17, 2021

(51) Int. Cl.
| | |
|---|---|
| *H01L 23/498* | (2006.01) |
| *H01L 23/00* | (2006.01) |
| *H01L 21/768* | (2006.01) |
| *H01L 21/60* | (2006.01) |

(52) U.S. Cl.
CPC .. *H01L 23/49816* (2013.01); *H01L 21/76819* (2013.01); *H01L 23/49883* (2013.01); *H01L 24/13* (2013.01); *H01L 24/46* (2013.01); *H01L 24/73* (2013.01); *H01L 24/81* (2013.01); *H01L 24/85* (2013.01); *H01L 2021/60135* (2013.01)

(58) Field of Classification Search
CPC .................................................. H01L 23/49816
USPC ........................................................ 257/737
See application file for complete search history.

(56) References Cited

U.S. PATENT DOCUMENTS

| | | |
|---|---|---|
| 3,008,764 A1 | 8/2011 | Joseph et al. |
| 9,236,366 B2 | 1/2016 | Roy et al. |
| 9,704,735 B2 | 7/2017 | Konchady et al. |
| 9,786,633 B2 | 10/2017 | Das et al. |
| 10,134,677 B1 * | 11/2018 | Chang Chien .... H01L 23/49816 |

(Continued)

FOREIGN PATENT DOCUMENTS

| | | |
|---|---|---|
| WO | 2018066113 A1 | 4/2018 |
| WO | 2019082795 A1 | 5/2019 |

OTHER PUBLICATIONS

U.S. Appl. No. 15/926,044, Title: "Direct Bonded Heterogeneous Integration Packaging Structures", filed Mar. 20, 2018, 26 pages, First named inventor: Kamal K. Sikka.

*Primary Examiner* — Ajay Arora
(74) *Attorney, Agent, or Firm* — Scully, Scott, Murphy & Presser, P.C.; Daniel P. Morris

(57) ABSTRACT

In some examples, an electronic package and methods for forming the electronic package are described. The electronic package can be formed by disposing an interposer on a surface of a substrate having a first pitch wiring density. The interposer can have a second pitch wiring density different from the first pitch wiring density. A layer of non-conductive film can be situated between the interposer and the surface of the substrate. A planarization process can be performed on a surface of the substrate. A solder resist patterning can be performed on the planarized surface the substrate. A solder reflow and coining process can be performed to form a layer of solder bumps on top of the planarized surface of the substrate. The interposer can provide bridge connection between at least two die disposed above the substrate. Solder bumps under the interposer electrically connect the substrate and the interposer.

11 Claims, 8 Drawing Sheets

(56) References Cited

U.S. PATENT DOCUMENTS

| | | | |
|---|---|---|---|
| 2011/0149539 A1* | 6/2011 | Shi | H01L 23/13 |
| | | | 361/764 |
| 2013/0032390 A1 | 2/2013 | Hu et al. | |
| 2014/0133119 A1* | 5/2014 | Kariya | H05K 3/0047 |
| | | | 361/767 |
| 2015/0195912 A1* | 7/2015 | Hurwitz | H01L 24/17 |
| | | | 174/262 |
| 2016/0021753 A1 | 1/2016 | Tomikawa et al. | |
| 2019/0013271 A1 | 1/2019 | Liu et al. | |
| 2021/0066189 A1* | 3/2021 | Chen | H01L 21/4857 |

\* cited by examiner

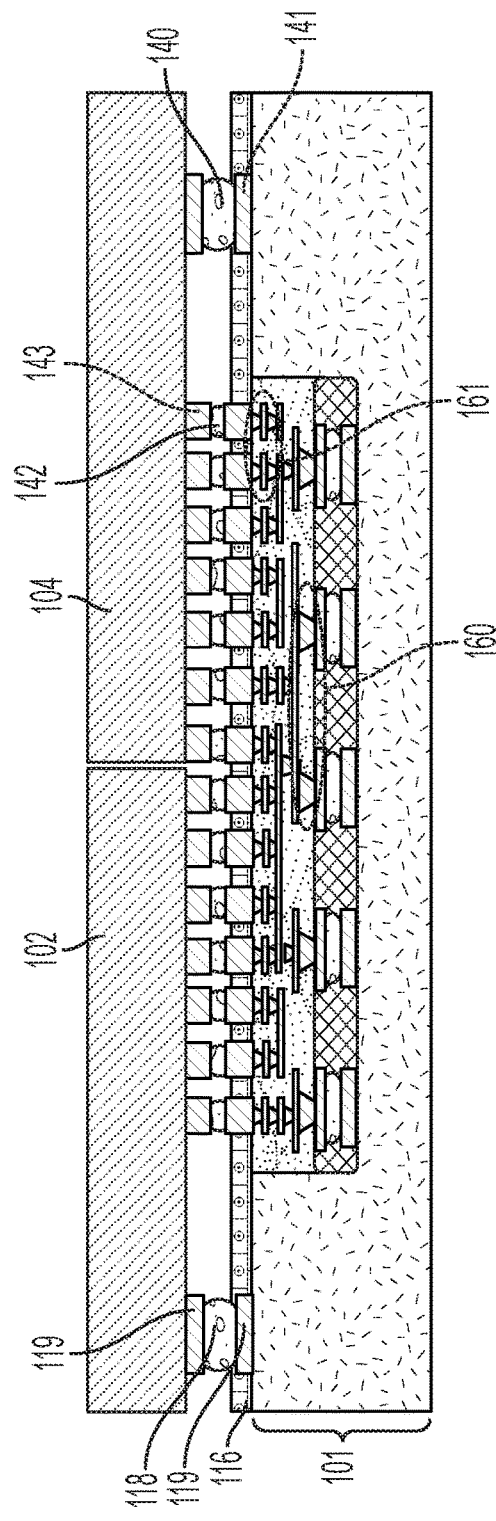
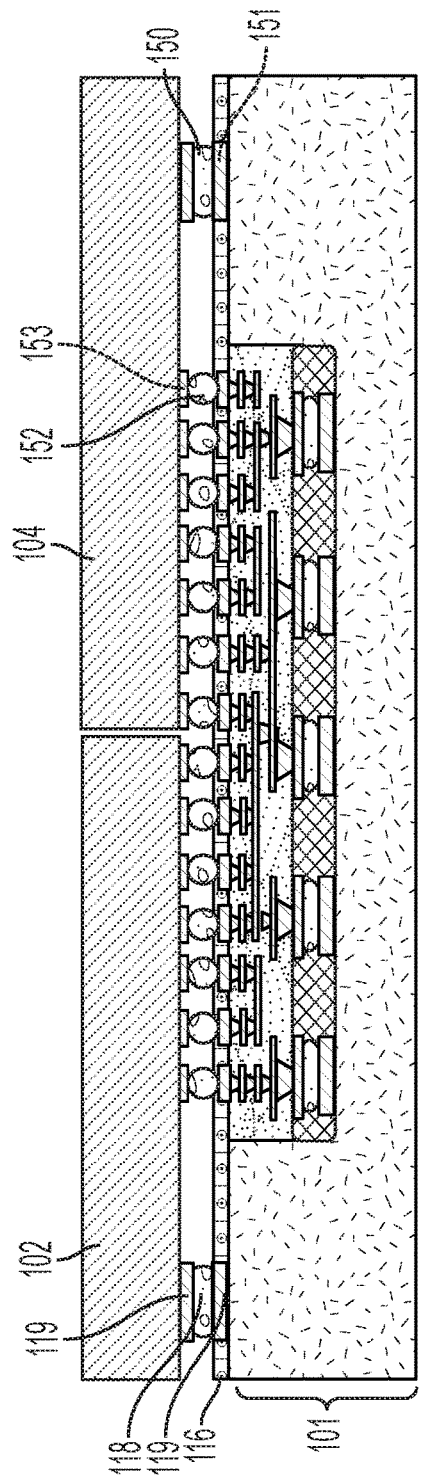
FIG. 1B
FIG. 1C

CIRCUIT SUBSTRATE WITH MIXED PITCH WIRING

BACKGROUND

The present disclosure relates in general to heterogeneous integration of hardware components using circuit substrate with mixed pitch wiring.

Heterogeneous integration technologies allow assembly and packaging of multiple separately manufactured components into a single chip to improve functionality and operating characteristics. For example, components of different functionalities, different process technologies, and sometimes separate manufacturers, can be packaged into a single chip. Examples of devices that can be formed by heterogeneous integration can include, for example, processors, signal processors, cache, sensors, photonics, radio frequency devices, and microelectromechanical systems (MEMS), and/or other types of devices.

SUMMARY

In some examples, a structure is generally described. The structure can include a substrate having a first pitch wiring density. The structure can further include an interposer embedded in the substrate, where the interposer can have a second pitch wiring density different from the first pitch wiring density. The interposer can provide bridge connection between at least two die disposed above the substrate. A layer of solder bumps under the interposer can provide electrical connection between the interposer and the substrate.

In some examples, a microelectronic package is generally described. The microelectronic package can include a substrate that can have a first pitch wiring density, at least two die located above the substrate, and an interposer embedded in the substrate. The interposer can have a second pitch wiring density different from the first pitch wiring density. The interposer can provide bridge connection between at least two die. A layer of solder bumps under the interposer can provide electrical connection between the interposer and the substrate.

In some examples, a method for forming an electronic package is generally described. The method can include disposing an interposer on a surface of a substrate having a first pitch wiring density. The interposer can have a second pitch wiring density different from the first pitch wiring density. A layer of non-conductive film can be situated between the interposer and the surface of the substrate. The method can further include performing a planarization process on a surface of the substrate. The method can further include performing solder resist patterning on the planarized surface the substrate. The method can further include performing a solder reflow and coining process to form a layer of solder bumps on top of the planarized surface of the substrate. The method can further include disposing at least two die on the layer of solder bumps. The interposer can provide bridge connection between at least two die disposed above the substrate. A layer of solder bumps under the interposer provides electrical connection between the substrate and the interposer.

Further features as well as the structure and operation of various embodiments are described in detail below with reference to the accompanying drawings. In the drawings, like reference numbers indicate identical or functionally similar elements.

BRIEF DESCRIPTION OF THE DRAWINGS

FIG. 1A-2 is a diagram showing an example structure including a circuit substrate with mixed pitch wiring in one embodiment.

FIG. 1B is a diagram showing additional details of an interposer of a circuit substrate with mixed pitch wiring in one embodiment.

FIG. 1C is a diagram showing additional details of an interposer of a circuit substrate with mixed pitch wiring in one embodiment.

FIG. 2 is a diagram showing another example structure including a circuit substrate with mixed pitch wiring in one embodiment.

DETAILED DESCRIPTION

Figures 1, 1A:
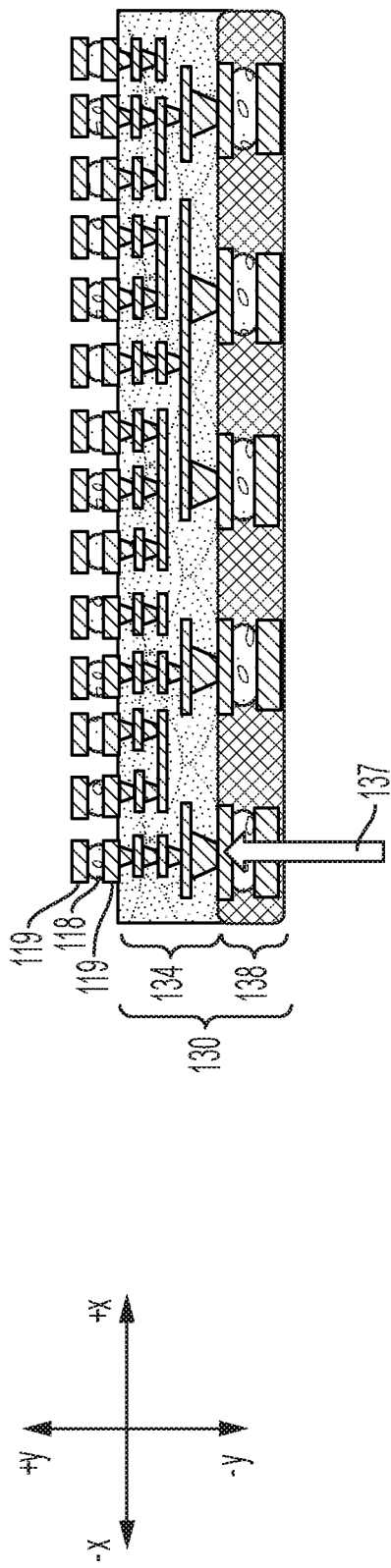
FIG. 1A-1 is a diagram showing an interposer of a circuit substrate with mixed pitch wiring in one embodiment.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following descriptions, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

A structure, such as a circuit substrate, can be constructed using a packaging technique described in accordance with the present disclosure. The circuit substrate can include combined organic laminate components of different wiring densities. The component with finer pitch wiring density can be used for bridging particular region(s) in the circuit substrate—instead of an entirety of the circuit substrate. Pitch wiring density can be, for example, a distance between vertical interconnect accesses (via) within the same layer of substrate. In the descriptions presented herein, pitch wiring density can also be referred to as "pitch", "line spacing", "pitch wiring", or "wiring density". In some examples, the pitch or line spacing can be referred to as a lower limit that a manufacturing technology (e.g., semiconductor manufacturing technology or the like) can accept in order to maintain a reasonable yield level (e.g., a desired or predefined yield level). Also, the packaging technique being described herein can provide relatively high ease of assembly, which can lead to lower cost in constructing the circuit substrate. Furthermore, the components with different pitch densities can be manufactured separately, such that they can be tested before being bonded together on the circuit substrate. The packaging technique being described herein can also reduce height differences between components by using a dry film planarization process, which can reduce the complexity of chip bond and assembly. Power feed can also be provided to the bridge region with the finer pitch as a result of constructing the circuit substrate using the packaging technique being described herein.

Figures 1, 1A, 2:
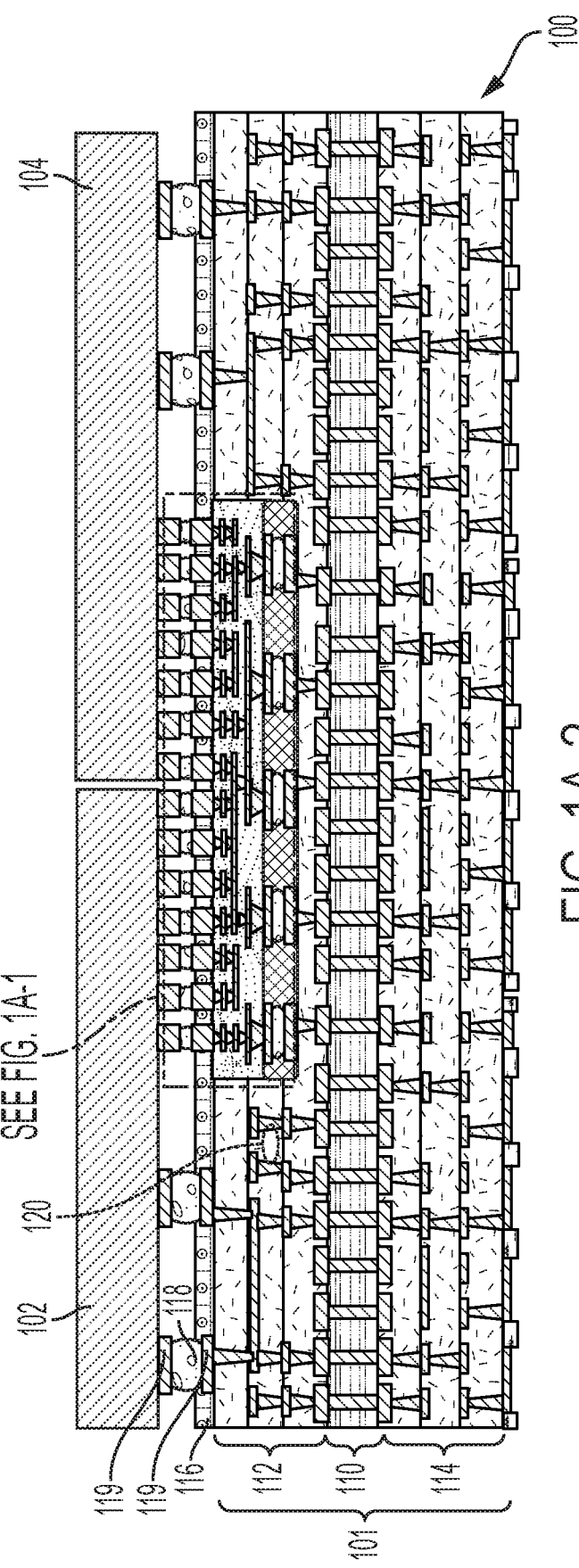
Figure 2:
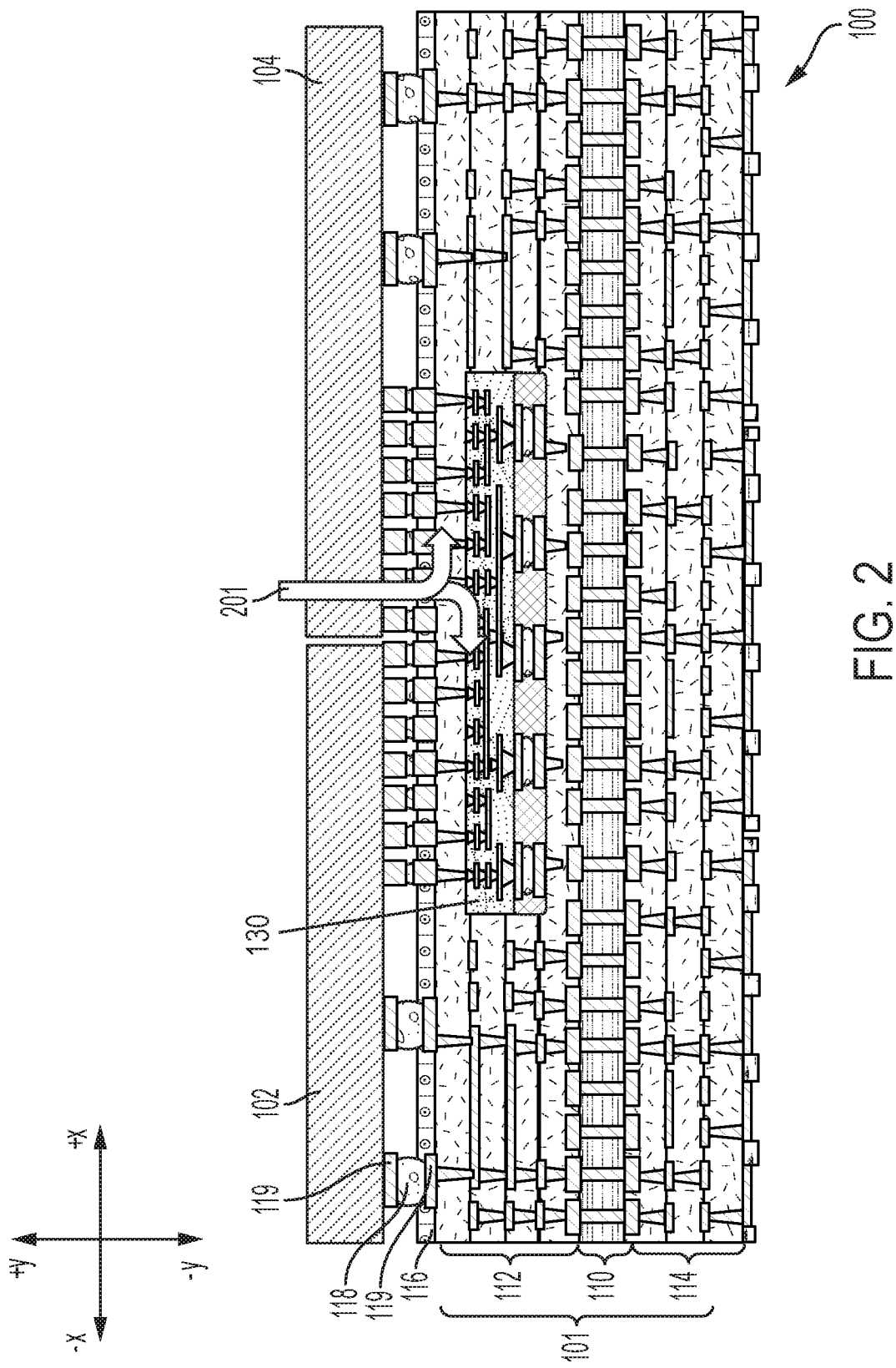

FIG. 1A-1 is a diagram showing an interposer of a circuit substrate with mixed pitch wiring in one embodiment. FIG. 1A-2 is a diagram showing architecture of an example structure 100 including a circuit substrate with mixed pitch wiring in one embodiment. The structure 100 can be an microelectronic package that can include a plurality of die, which can include hardware components and/or devices, such as memory, processors, microcontrollers, field-programmable-gate-array (FPGA) modules, and/or other types of hardware components and devices. The structure 100 can further include a substrate 101 and an interposer 130. The substrate 101 and/or the interposer 130 can be composed of organic materials, such as but not limited to, polymers composed of carbon and hydrogen atoms, or heteroatoms such as nitrogen, sulfur and oxygen. Organic materials can be realized as molecular crystals or amorphous thin films. In some examples, organic materials can be electrical insulators, and can also become semiconductors when charges are injected from particular electrodes upon doping or by photoexcitation.

In an example shown in FIG. 1A-2, the structure 100 can include a device 102 and a device 104, where the devices 102 and 104 can be electrically connected through the interposer 130 (described below). Although devices 102 and 104 are shown in the example of FIG. 1A-2, additional number of devices and different combinations of heterogeneous devices can be disposed above the substrate 101. The substrate 101 can include a plurality of layers, such as a core 110, a plurality of build-up layers 112 disposed on top of, or above (+y direction), the core 110, and a plurality of build-up layers 114 situated under, or below (−y direction), the core 110. The build-up layers within 112, 114 can include same or different wiring layout and configurations. A dry film layer 116, which can include dry film photoresist materials, can be disposed on a surface (e.g., a top surface) of the substrate 101 and a surface (e.g., a top surface) of the interposer 130. The dry film layer 116 can be used to planarize the surface of the structure 100 (e.g., flattening the top surface of the structure 100). Further, a layer of solder bumps ("bumps") 118, which can be controlled-collapse bonding (CCB) bumps or controlled-collapse chip connection (C4) bumps, can be formed on top of the dry film layer 116 to provide vertical connectivity (e.g., +y and −y directions) between the interposer 130 and the devices 102, 104, and between the substrate 101 and the devices 102, 104. The layer of bumps 118 can be connected to the interposer 130 using a layer of solder base 119. The layer of solder base 119 can include pillars and pads of different sizes. A pillar can be, for example, a solder base having an aspect ratio where a height of the solder base (e.g., +/−y-direction) is greater than a width or diameter (e.g., +/−x-direction) of the solder base. A pad can be, for example, a solder base having an aspect ratio where a width or diameter (e.g., +/−x-direction) of the solder base is greater than a height (e.g., +/−y-direction) of the solder base. In some examples, the layer of solder base 119 can include copper pillars or copper pads.

The interposer 130 can be embedded in the substrate 101. A depth in which the interposer 130 is embedded can vary, and can be dependent on a desired implementation. The example embodiment in FIG. 1A-2 shows that the interposer 130 is embedded in the substrate 101 such that a surface of the interposer 130 is exposed or attached to the dry film layer 116. In some examples, the surface of the interposer 130 can be aligned with a surface of the substrate 101. The interposer 130 can include at least one layer of organic materials 134, which can also be dielectric materials. At least one layer of organic materials 134 can have a pitch wiring density that can be less than a pitch wiring density of the wiring of substrate 101. For instance, the interposer 130 can have finer pitch wiring than a wiring density 120 in the substrate 101, or the wiring density 120 in the substrate 101 can have coarser pitch wiring than the interposer 130. In an example, the wiring density 120 can be a lower limit acceptable to the manufacturing technology being used to form the substrate 101 in order to maintain a desired yield level.

The finer pitch wiring of the interposer 130 can provide bridge connection between the devices 102 and 104. Further, the interposer 130 can include a layer of solder bumps (CCB or C4 bumps) 138 under (−y direction) the layers of organic materials 134. The layer of solder bumps 138 can provide vertical (e.g., +y and −y directions) electrical connection with the substrate 101. The vertical electrical connection provided by the layer of solder bumps 138 allows vertical power feed to the devices 102 and 104 through the interposer 130, as shown by a path 137 in FIG. 1A-1.

The utilization of the interposer 130 provides a cost-effective way to integrate heterogeneous devices on a chip. For example, the fine pitch in the interposer 130 can provide relatively more efficient (e.g., faster) routing of information between the devices 102, 104 when compared to using coarser pitch wiring (e.g., wiring density 120 in the substrate 101). Further, the interposer 130 can be manufactured separately from the substrate, which enables testing of the wiring in the interposer 130 prior to embedding or bonding the interposer 130 to the substrate 101. Furthermore, a surface area of the top surface of the interposer 130 can be less than a surface area of the top surface of the substrate 101. Therefore, the interposer 130 can be embedded in a particular portion of the substrate 101, which can eliminate a need to manufacture an interposer with fine pitch interconnect that can span an entirety of a surface area of the structure 100, and can reduce manufacturing costs.

FIGS. 1B and 1C are diagrams showing additional details of an interposer of a circuit substrate with mixed pitch wiring in one embodiment. FIG. 1B may include components that are labeled identically to components of FIG. 1A-1 and FIG. 1A-2, which are not described again for the purposes of clarity. The description of FIG. 1B may reference at least some of the components of FIG. 1A-1 and FIG. 1A-2.

In an example embodiment shown in FIG. 1B, the layers of bumps 118 can include one or more bumps of different sizes, and the layer of solder base 119 can include one or more pillars or pads of different shapes and sizes. For example, the bumps 140 and 142 shown in FIG. 1B can have different dimensions and/or sizes, the solder base 141 can be a copper pillar, and the solder base 143 can be a copper pad. The different sizes of bumps and pillars or pads can address the difference between the pitch wiring densities of the interposer 130 and the substrate 101. For example, the distance between the bumps above the interposer 130 (between the interposer 130 and the devices 102, 104) may be less than the distance between the bumps above the substrate 101 (between the substrate 101 and the devices 102, 104) to accommodate the finer pitch wiring density of the interposer 130. The diameters of the bumps above the interposer 130 may be adjusted (e.g., reduced) to accommodate the small distance between these bumps. The reduced diameter of the bumps above the interposer 130 may cause a distance, in the +/−y-direction, between the interposer 130 and the device 102, 104 to increase. A size, such as the height of the pillars or pads among the solder base 119 may need to be adjusted to accommodate the reduced diameters of the bumps above the interposer 130. For example, copper pillars may address the need for increased distance between the interposer 130 and the devices 102, 104. As shown in the example of FIG. 1B, the bump 142 can have a diameter less than a diameter of a bump 140, and a height of a copper pillar 143 can be greater than a height of the copper pad 141.

Further, in the example embodiment shown in FIG. 1B, at least one layer of organic materials 134 of the interposer 130 can include more than one sets of wiring with different pitch. For example, a set of wiring 160 may have a coarser pitch wiring density when compared to a set of wiring 161. The different sizes of bumps and solder base can address potential effects resulting from coefficient of thermal expansion (CTE) mismatches among the different pitch wiring densities within the interposer, and among the different materials that form the structure 100.

In another example shown in FIG. 1C, the distance, in the +/−x-direction, between the bumps above the interposer 130 may be less than the distance, in the +/−x-direction, between the bumps above the substrate 101 to accommodate the finer pitch wiring density of the interposer 130. The diameters of the bumps above the interposer 130 may be adjusted (e.g., reduced) to accommodate the small distance between these bumps. The reduced diameter of the bumps above the interposer 130 may cause a distance between the interposer 130 and the device 102, 104 to increase. The devices 102, 104 can be disposed closer to the interposer (e.g., in the −y direction) to connect the device 102, 104 to the interposer 130 through the bumps 118 and the solder base 119. The height of the bumps 118 above the substrate 101 can be adjusted (e.g., decreased) to accommodate the reduced distance between the devices 102, 104, and the interposer 130. For example, the height of the bumps 118 can be adjusted by adjusting the volume of solder being used to form the bumps 118. The example shown in FIG. 1C can allow using copper pads, such as 151 and 153, to connect the bumps 118 above the interposer 130 with the devices 102, 104. As shown in the example of FIG. 1C, a bump 152 can have a different shape from a bump 150, and the bump 152 can have a diameter less than a diameter of the bump 150 in the +/−x-direction, to accommodate the distance between the interposer 130 and devices 102, 104.

FIG. 2 is a diagram showing another example structure including a circuit substrate with mixed pitch wiring in one embodiment. In an example embodiment shown in FIG. 2, the interposer 130 is embedded relatively deeper into the substrate 101 when compared to the embodiment shown in FIG. 1A-2. For example, in FIG. 2, the surface of the interposer 130 is not exposed to or attached to the dry film layer 116, and a layer among the build-up layers 112 can be situated between the interposer 130 and the dry film layer 116. Embedding the interposer deeper into the substrate 101 can provide additional flexibility in wiring. For example, data being transmitted by the device 104 can be routed through a path 201 to the device 102 (e.g., inter-chip communication), and also toward other components that can receive the transmitted data through the substrate 101 (e.g., signal fanout).

Figure 3A:
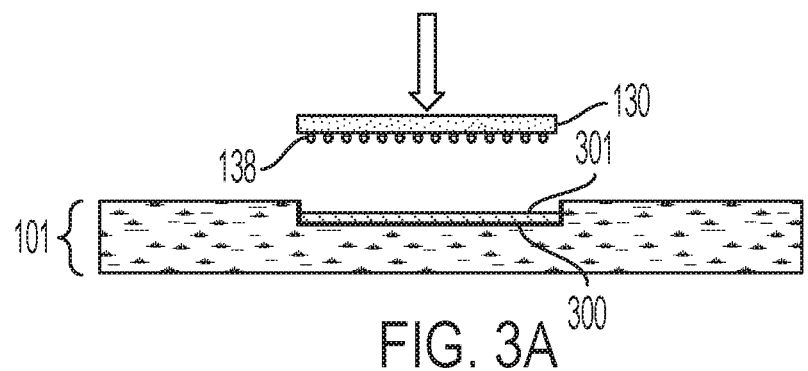
FIG. 3A is a diagram illustrating a recess being patterned in a substrate in a process to form a circuit substrate with mixed pitch wiring in one embodiment.
Figure 3B:
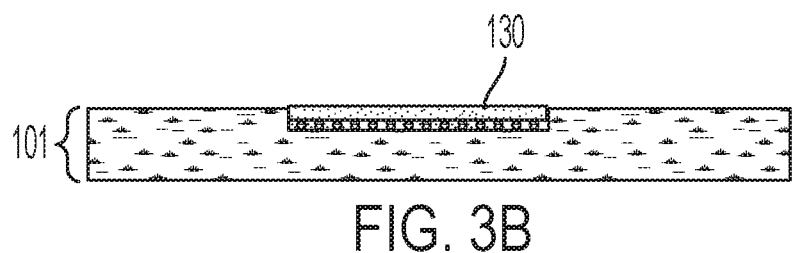
FIG. 3B is a diagram illustrating an interposer being embedded into the substrate in a process to form a circuit substrate with mixed pitch wiring in one embodiment.
Figure 3C:
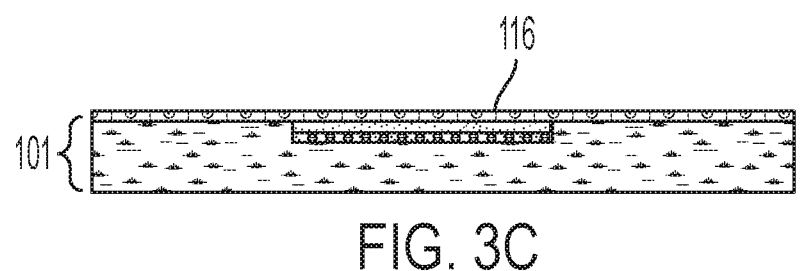
FIG. 3C is a diagram illustrating an application of a dry film layer on the embedded interposer and the substrate in a process to form a circuit substrate with mixed pitch wiring in one embodiment.
Figure 3D:
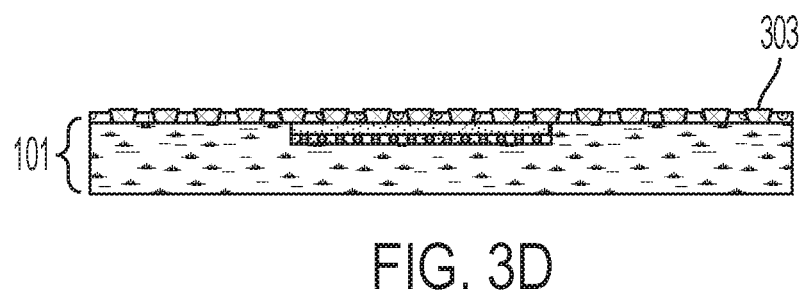
FIG. 3D is a diagram illustrating a result from a solder resist patterning process in forming a circuit substrate with mixed pitch wiring in one embodiment.
Figure 3E:
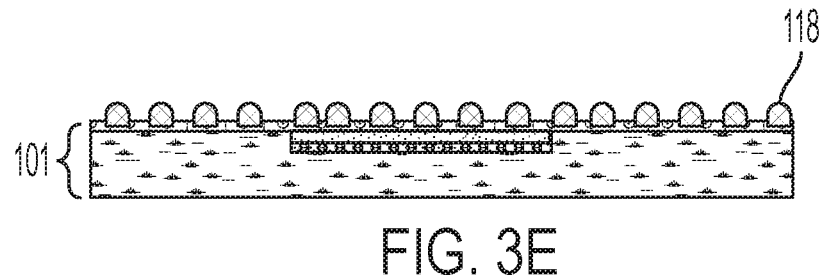
FIG. 3E is a diagram illustrating a result from a solder reflow and coining process in a process to form a circuit substrate with mixed pitch wiring in one embodiment.

FIGS. 3A-3E are diagrams illustrating details of a process to form a circuit substrate with mixed pitch wiring in one embodiment. FIG. 3A is a diagram illustrating a recess being patterned in a substrate. FIG. 3B is a diagram illustrating an interposer being embedded into the substrate. FIG. 3C is a diagram illustrating an application of a dry film layer on the embedded interposer and the substrate. FIG. 3D is a diagram illustrating a result from a solder resist patterning process. FIG. 3E is a diagram illustrating a result from a solder reflow and coining process. FIGS. 3A-3E may include components that are labeled identically to components of FIGS. 1A-2, which will not be described again for the purposes of clarity. The description of FIGS. 3A-3E may reference at least some of the components of FIGS. 1A-2.

Formation of the example structure 100 shown in FIG. 1A-2 can begin with formation of a recess 300 in the substrate 101 (see FIG. 3A). The recess 300 can be form by removing a portion of the substrate 101, such as by using various etching and patterning techniques (e.g., photolithography). A layer of non-conductive film 301 can be disposed onto a surface (e.g., top surface) of the recess 300 (see FIG. 3A). The non-conductive film 301 can be composed materials with relative high cohesive strength, such as epoxy films. The interposer 130 can be disposed on the substrate 101 using non-conductive film 301 to reinforce the solder bumps 138 (see FIG. 3B). In some examples, the interposer 130 can be disposed on the non-substrate 101 using flip-chip mounting techniques, and using non-conductive film 301 to reinforce the solder bumps 138. In another embodiment, the layer of non-conductive film 301 can be disposed onto a surface (e.g., bottom surface) of the interposer 130 prior to situating the interposer 130 in the recess 300. Further, the finer pitch wiring of the interposer 130 can be connected to the coarser pitch wiring of the substrate 101 by mass solder reflow or thermal compression bonding techniques.

The dry film layer 116 can be applied onto a surface (e.g., top surface) of the interposer 130 and to a top surface of the substrate 101. The application of the dry film layer 116 can be a part of a planarization process (shown in FIGS. 5A-5C) to planarize the top surface of the structure 100. FIG. 3C illustrates a result of the planarization process, where a top surface of the dry film 116 is planarized, which causes the top surface of the structure 100 to be planarized. Note that the planarization process can eliminate a height difference between the top surface of the interposer 130 and the top surface of the substrate 101. In some examples, the planarization process can include a presolder coining process.

FIG. 3D illustrates a process of solder resist patterning on the dry film layer 116. In an example, the dry film layer 116 can be patterned to form an array of recesses, and solder resist 303 can be disposed into the formed recesses. The structure in FIG. 3D can be subjected to a solder reflow and coining process to form the layer of CCB or C4 bumps 118 (see FIG. 3E). Devices can be disposed on top of the layer of bumps 118, as shown in the example embodiment of FIG. 1A-2. In some examples, solder base of different shapes and sizes can be disposed on the top surfaces of the substrate 101 and/or the interposer 130 to accommodate differences in pitch wiring densities between the interposer 130 and the substrate 101.

Figure 4:
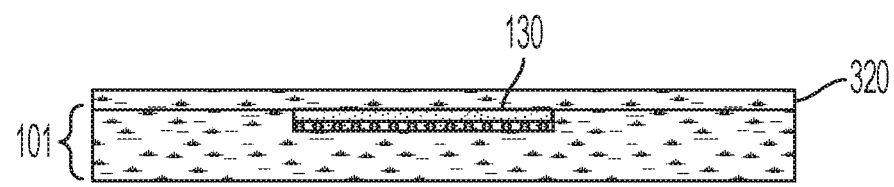
FIG. 4 is a diagram illustrating an application of a build-up layer on an interposer in a process to form a circuit substrate with mixed pitch wiring in one embodiment.

FIG. 4 is a diagram illustrating an application of a build-up layer on an interposer. Formation of the example structure 100 shown in FIG. 2 can include the processes shown by FIGS. 3A-3B, and also a process illustrated in FIG. 4. To embed the interposer 130 deeper into the substrate 101, a build-up layer 320 can be disposed on top of the interposer 130 and the substrate 101 (after the process shown in FIG. 3B). The formation of the structure 100 shown in FIG. 2 can continue with the planarization process described above with respect to FIG. 3C, such that the dry film layer 116 is disposed above the build-up layer 320. The formation of the structure 100 shown in FIG. 2 can continue with the solder reflow and coining process described above with respect to FIGS. 3D and 3E. In an example, a height of the recess 300 can be designed to be equivalent to a thickness of the interposer 130. In another example, if the thickness of the interposer 130 is greater than the height of the recess 300, the thickness of the interposer 130 can be adjusted prior to disposing the interposer 130 into the recess 300. In another example, the thickness of the interposer 130 can be adjusted after disposing the interposer 130 by using, for example, etching techniques to etch away materials of the interposer 130 to decrease the thickness of the interposer 130.

Figure 5A:
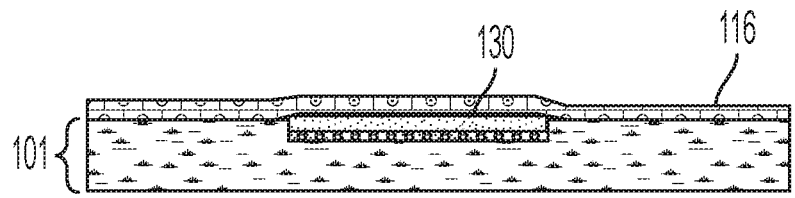
FIG. 5A is a diagram illustrating an application of a dry film layer on an interposer and a substrate in a process to form a circuit substrate with mixed pitch wiring in one embodiment.
Figure 5B:
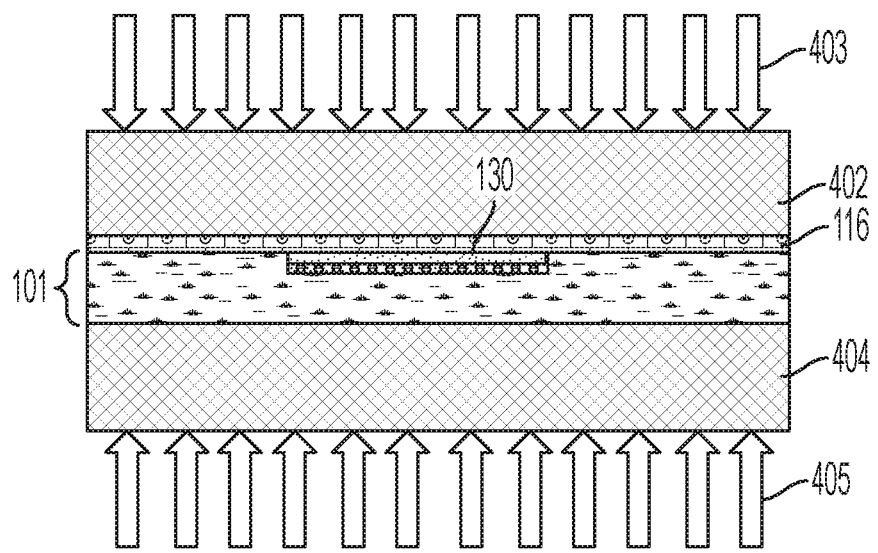
FIG. 5B is a diagram illustrating a planarization process in forming a circuit substrate with mixed pitch wiring in one embodiment.
Figure 5C:
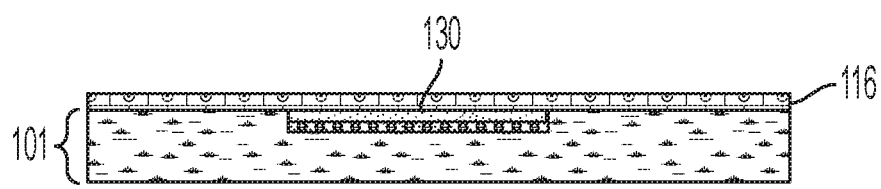
FIG. 5C is a diagram illustrating a result from the planarization process in forming a circuit substrate with mixed pitch wiring in one embodiment.

FIGS. 5A-5C are diagrams illustrating details of a process to form a circuit substrate with mixed pitch wiring in one embodiment. FIG. 5A is a diagram illustrating an application of a dry film layer on an interposer and a substrate. FIG. 5B is a diagram illustrating a planarization process. FIG. 5C is a diagram illustrating a result from the planarization process. The planarization process described herein can begin with a process shown in FIG. 5A. In FIG. 5A, the dry film layer 116 is disposed on a surface of the interposer 130 and a surface of the substrate 101. In FIG. 5B, a plate 402 can be disposed or applied above the dry film layer 116, and a plate 404 can be situated under the substrate 101. In an example embodiment, the plates 402, 404 can be metal plates. An amount of pressure 403 can be applied on the plate 402, and an amount of pressure 405 can be applied on the plate 404, to flatten the dry film layer 116 and align the top surfaces of the interposer 130 and the top surface of the substrate 101. In FIG. 5C, the plates 402 and 404 can be removed, resulting in the structure 100 shown in FIG. 1A-2. The thickness of the dry film layer 116 can be variable and based on a desirable implementation. For example, the dry film layer 116 can be approximately 20 to 40 micrometers ($\mu m$) thick, such that a height difference between the top surfaces of the interposer 130 and the substrate 101 can be absorbed into the dry film layer 116. In another example embodiment, the dry film layer 116 can be flattened by utilizing a hydraulic oil press to flatten the dry film layer 116.

Figure 6A:
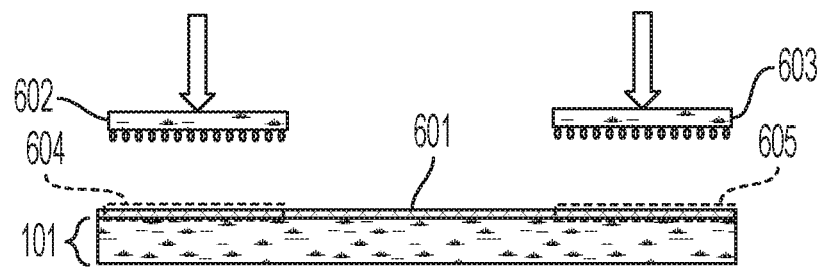
FIG. 6A is a diagram illustrating an application of one or more build-up layers on a substrate in a process to form a circuit substrate with mixed pitch wiring in one embodiment.
Figure 6B:
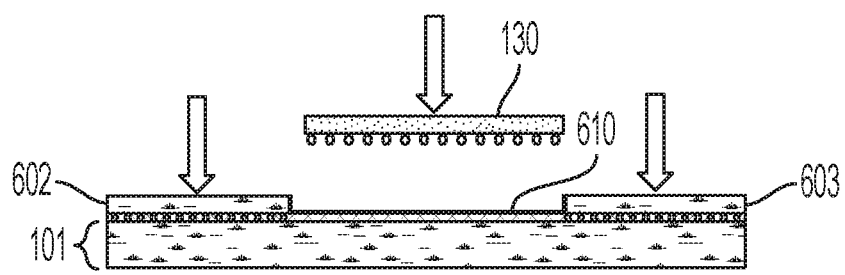
FIG. 6B is a diagram illustrating an application of an interposer on a substrate in a process to form a circuit substrate with mixed pitch wiring in one embodiment.
Figure 6C:
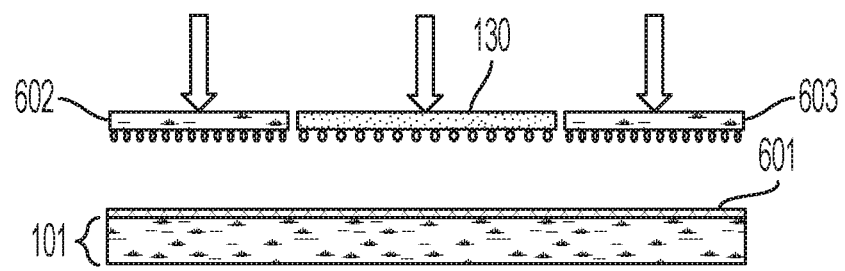
FIG. 6C is a diagram illustrating an application of an interposer and one or more build-up layers on a substrate in a process to form a circuit substrate with mixed pitch wiring in one embodiment.
Figure 6D:
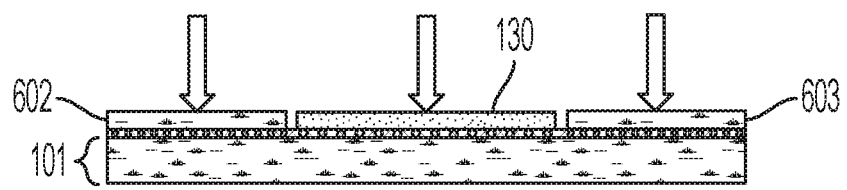
FIG. 6D is a diagram illustrating a result from an application of an interposer and one or more build-up layers on a substrate in a process to form a circuit substrate with mixed pitch wiring in one embodiment.

FIGS. 6A-6D are diagrams illustrating details of a process to form a circuit substrate with mixed pitch wiring in one embodiment. FIG. 6A is a diagram illustrating an application of one or more build-up layers on a substrate. FIG. 6B is a diagram illustrating an application of an interposer on a substrate. FIG. 6C is a diagram illustrating an application of an interposer and one or more build-up layers on a substrate. FIG. 6D is a diagram illustrating a result from an application of an interposer and one or more build-up layers on a substrate.

In an example embodiment shown in FIGS. 6A-6B, a recess 610 can be formed without removing portions of the substrate 101. In FIG. 6A, a layer of non-conductive film 601 can be disposed onto a top surface of the substrate 101. The non-conductive film 601 can be composed materials with relatively high cohesive strength, such as epoxy films. A build-up layer 602 and a build-up layer 603 can be disposed on the non-conductive film 601 at locations 604, 605, respectively. The build-up layers 602 and 603 can be bonded to the substrate 101 by using the non-conductive film 601 to reinforce solder bumps attached to bottom surfaces of build-up layers 602 and 603. As a result of adding or disposing the build-up layers 602 and 603 onto the substrate 101, a recess 610 can be formed between the locations 604 and 605 (as shown in FIG. 6B). The interposer 130 can be disposed into the recess 610 and on the substrate 101, where the non-conductive film 610 reinforces the solder bums 138 of the interposer 130. In another embodiment, the layer of non-conductive film 601 can be disposed onto a surface (e.g., bottom surface) of the interposer 130 prior to situating the interposer 130 in the recess 610.

In an example embodiment shown in FIGS. 6C-6D, the interposer 130, the build-up layer 602, and the build-up layer 603 can be disposed on the non-conductive film 601. In some examples, the build-up layer 602, and the build-up layer 603 can be disposed on the non-conductive film 601 simultaneously, resulting in the structure shown in FIG. 6D.

Figure 7:
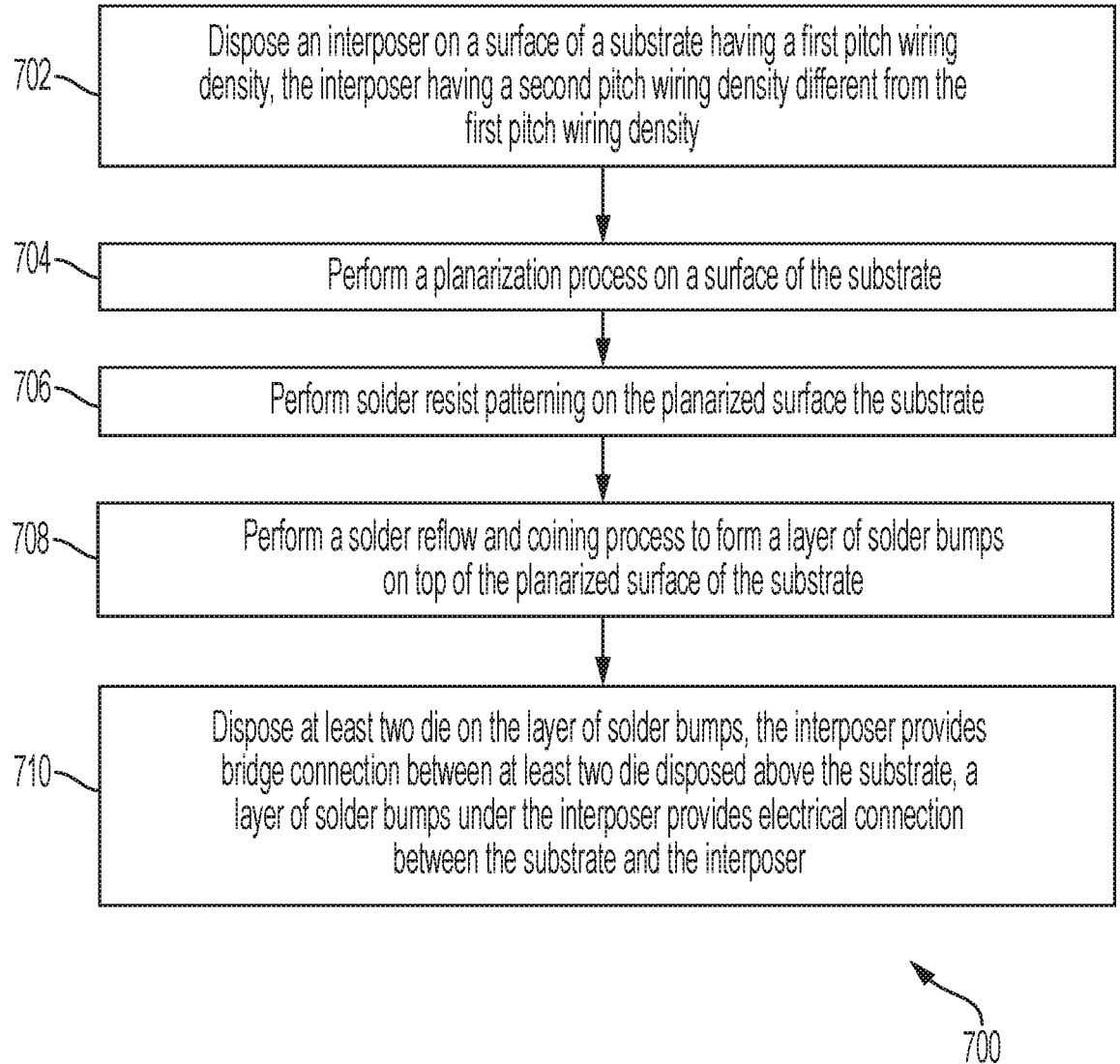
FIG. 7 is a flow diagram illustrating a method of forming a circuit substrate with mixed pitch wiring in one embodiment.

FIG. 7 is a flow diagram illustrating a method of forming a circuit substrate with mixed pitch wiring in one embodiment. An example process may include one or more operations, actions, or functions as illustrated by one or more of blocks 702, 704, 706, 708, and/or 710. Although illustrated as discrete blocks, various blocks can be divided into additional blocks, combined into fewer blocks, eliminated, or performed in parallel, depending on the desired implementation.

A process 700 can begin at block 702, where an interposer is disposed on a surface of a substrate having a first pitch wiring density. The interposer can have a second pitch wiring density different from the first pitch wiring density. The interposer can be composed of organic materials. The first pitch wiring density can be coarser than the second pitch wiring density. A layer of non-conductive film can be situated between the interposer and the surface of the substrate. In an example, the layer of non-conductive film can be formed on the surface of the substrate. In another example, the layer of non-conductive film can be formed on a bottom surface of the interposer. In an example embodiment, a recess can be patterned in the substrate, the layer of nonconductive film can be applied on a surface of the recess, and the interposer can be disposed on top of the nonconductive film and embedded into the recess. In another example embodiment, the recess can be patterned by disposing a first build-up layer on the surface of the substrate at a first location and disposing a second build-up layer on the surface of the substrate at a second location, where the recess can be formed between the first and second locations.

The process 700 can continue from block 702 to 704. At block 704, a planarization process can be performed on a surface of the substrate. In some examples, the planarization process can include applying a layer of dry film on the surface of the substrate and flattening the layer of dry film. The process 700 can continue from block 704 to 706. At block 706, a solder resist patterning on the planarized surface the substrate. The process 700 can continue from block 706 to 708. At block 708, a solder reflow and coining process can be performed to form a layer of solder bumps on top of the planarized surface of the substrate. The process 700 can continue from block 708 to 710. At block 710, at least two die can be disposed on the layer of solder bumps. The interposer can provide bridge connection between at least two die disposed above the substrate. A layer of solder bumps under the interposer can provide electrical connection between the substrate and the interposer.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A structure comprising:
   a substrate having a first pitch wiring density;
   an interposer embedded in a build-up layer of the substrate that is disposed on top of a core of the substrate, the core is underneath the interposer, the interposer including a dielectric layer having a second pitch wiring density different from the first pitch wiring density, wherein:
   the interposer provides bridge connection between at least two die disposed above the substrate; and
   the interposer includes a layer of solder bumps under the dielectric layer, wherein the layer of solder bumps provides vertical electrical connection between the core underneath the interposer, and a device on top of the interposer.

2. The structure of claim 1, wherein the interposer is composed of organic materials.

3. The structure of claim 1, wherein the first pitch wiring density is coarser than the second pitch wiring density.

4. The structure of claim 1, wherein a surface area of a top surface of the interposer is less than a surface area of a top surface of the substrate.

5. The structure of claim 1, wherein at least a portion of the build-up layer of the substrate is situated between the at least two die and the interposer.

6. A microelectronic package comprising:
   a substrate having a first pitch wiring density;
   at least two die located above the substrate; and
   an interposer embedded in a build-up layer of the substrate that is disposed on top of a core of the substrate, the core is underneath the interposer, the interposer including a dielectric layer having a second pitch wiring density different from the first pitch wiring density, wherein:
   the interposer provides bridge connection between the at least two die; and
   the interposer includes a layer of solder bumps under the dielectric layer, wherein the layer of solder bumps provides vertical electrical connection between the core underneath the interposer, and a device on top of the interposer.

7. The microelectronic package of claim 6, wherein the interposer is composed of organic materials.

8. The microelectronic package of claim 6, wherein the first pitch wiring density is coarser than the second pitch wiring density.

9. The microelectronic package of claim 6, wherein a surface area of a top surface of the interposer is less than a surface area of a top surface of the substrate.

10. The microelectronic package of claim 6, wherein the top surface of the substrate and a top surface of the interposer is planarized using a dry film.

11. The microelectronic package of claim 6, wherein at least a portion of the build-up layer of the substrate is situated between the at least two die and the interposer.

* * * * *